US007847470B2

(12) United States Patent
Kuroda

(10) Patent No.: US 7,847,470 B2
(45) Date of Patent: Dec. 7, 2010

(54) SURFACE MOUNTING PIEZOELECTRIC OSCILLATOR

(75) Inventor: Tomotaka Kuroda, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 28 days.

(21) Appl. No.: 11/904,526

(22) Filed: Sep. 26, 2007

(65) Prior Publication Data

US 2008/0079505 A1 Apr. 3, 2008

(30) Foreign Application Priority Data

Sep. 28, 2006 (JP) .............................. 2006-264185

(51) Int. Cl.
*H01L 41/047* (2006.01)
*H01L 41/053* (2006.01)

(52) U.S. Cl. .................. 310/348; 310/365; 310/366

(58) Field of Classification Search .................. 310/348, 310/365, 366

See application file for complete search history.

(56) References Cited

U.S. PATENT DOCUMENTS

| 5,353,621 | A | * | 10/1994 | Knecht et al. ............... 72/379.2 |
| 7,535,723 | B2 | * | 5/2009 | Belopolsky .................. 361/760 |
| 2001/0030882 | A1 | * | 10/2001 | Pitzele ........................ 363/147 |
| 2005/0212387 | A1 | * | 9/2005 | Sasagawa et al. ............ 310/348 |
| 2005/0258913 | A1 | * | 11/2005 | Ito et al. ..................... 331/158 |
| 2007/0035214 | A1 | * | 2/2007 | Kasahara ..................... 310/348 |

FOREIGN PATENT DOCUMENTS

| JP | 2000-252748 | | 9/2000 |
| JP | 2003-017940 | * | 1/2003 |

OTHER PUBLICATIONS

Machine translation of JP 2003-017940 from JPO, Jan. 2003.*

* cited by examiner

*Primary Examiner*—Walter Benson
*Assistant Examiner*—Derek J Rosenau
(74) *Attorney, Agent, or Firm*—Woodcock Washburn LLP

(57) ABSTRACT

To provide high reliable surface mounting oscillator that solder does not leak out by heat from the oscillator. The base print board with a terminal on the first surface and a concave on the second surface which is the opposite side of the first surface, the metal strut fixed to the concave, the sub print board has piezoelectric vibrator supported by the metal strut, the base print board, the cover which covers the metal strut and the sub print board.

7 Claims, 6 Drawing Sheets

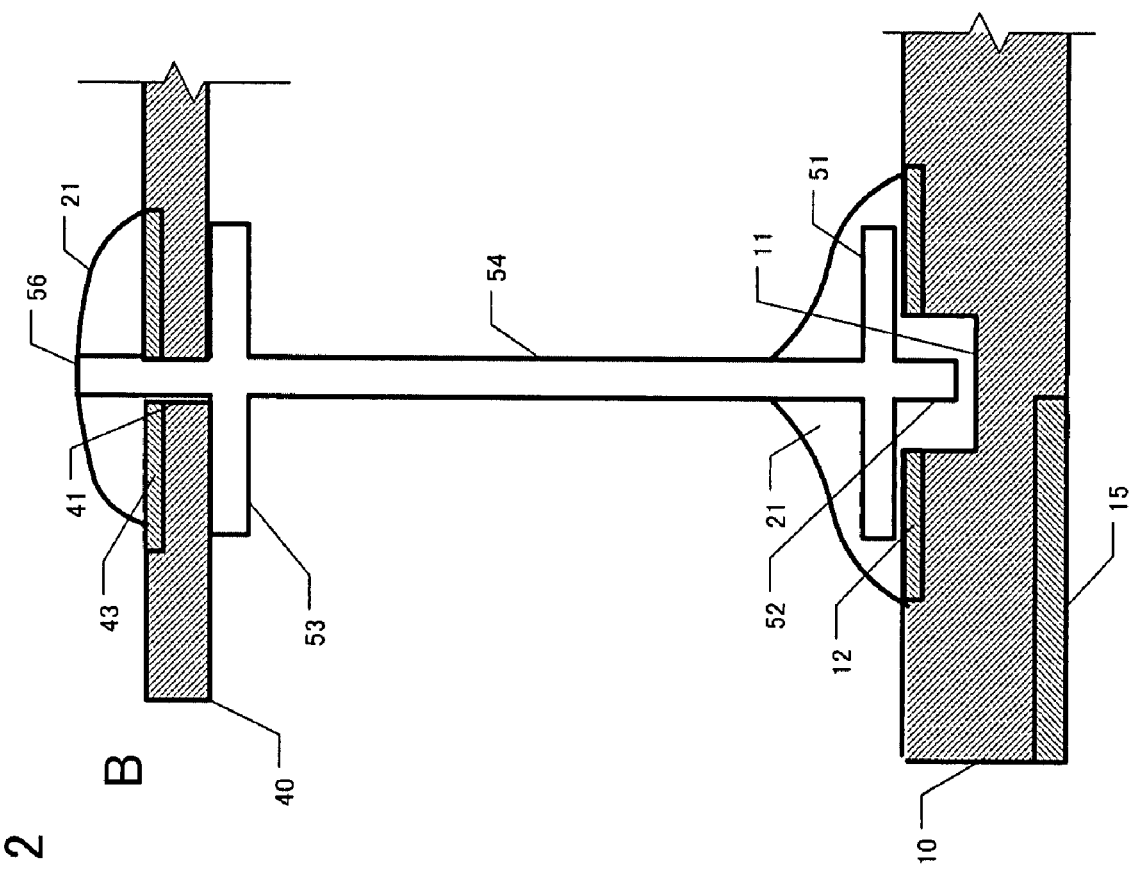
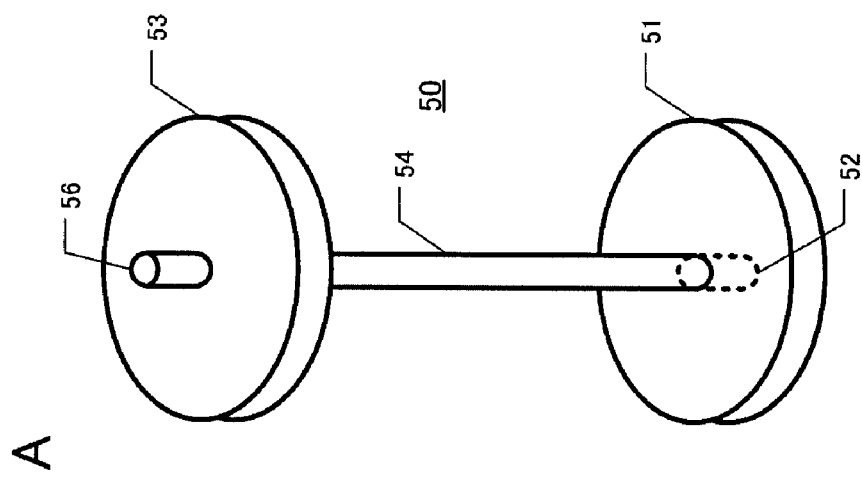
FIG. 2

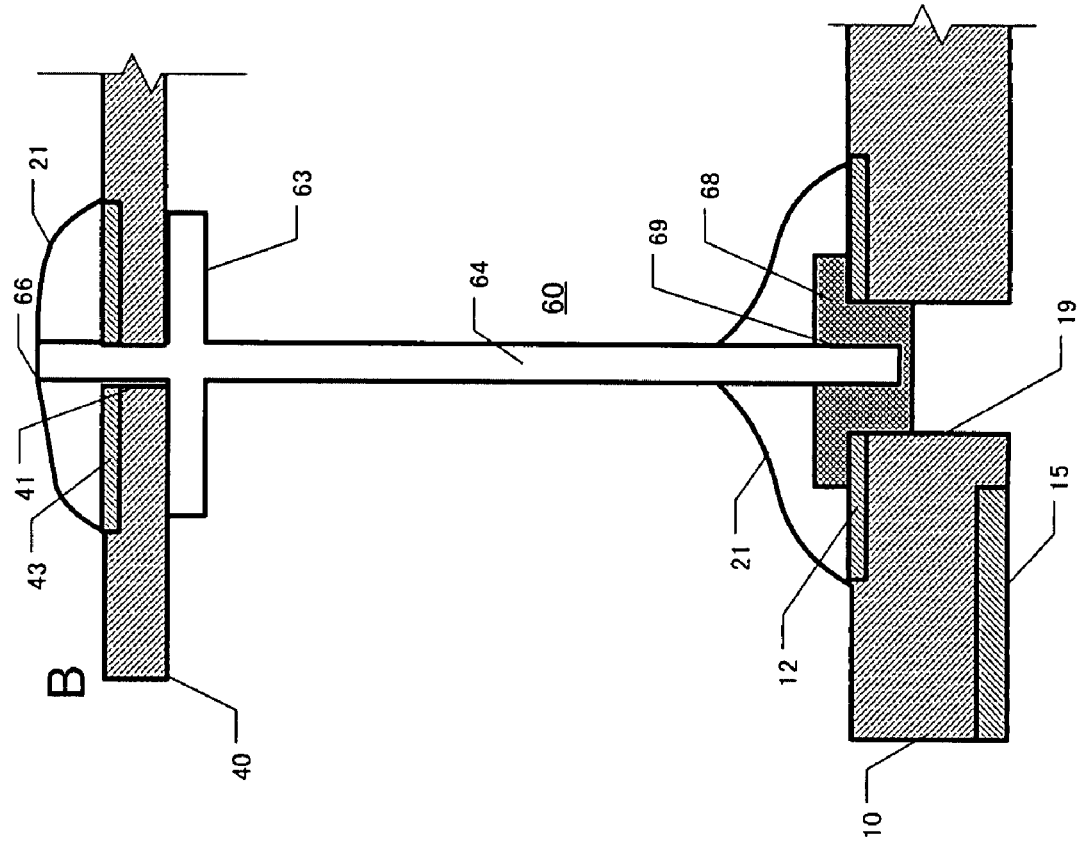
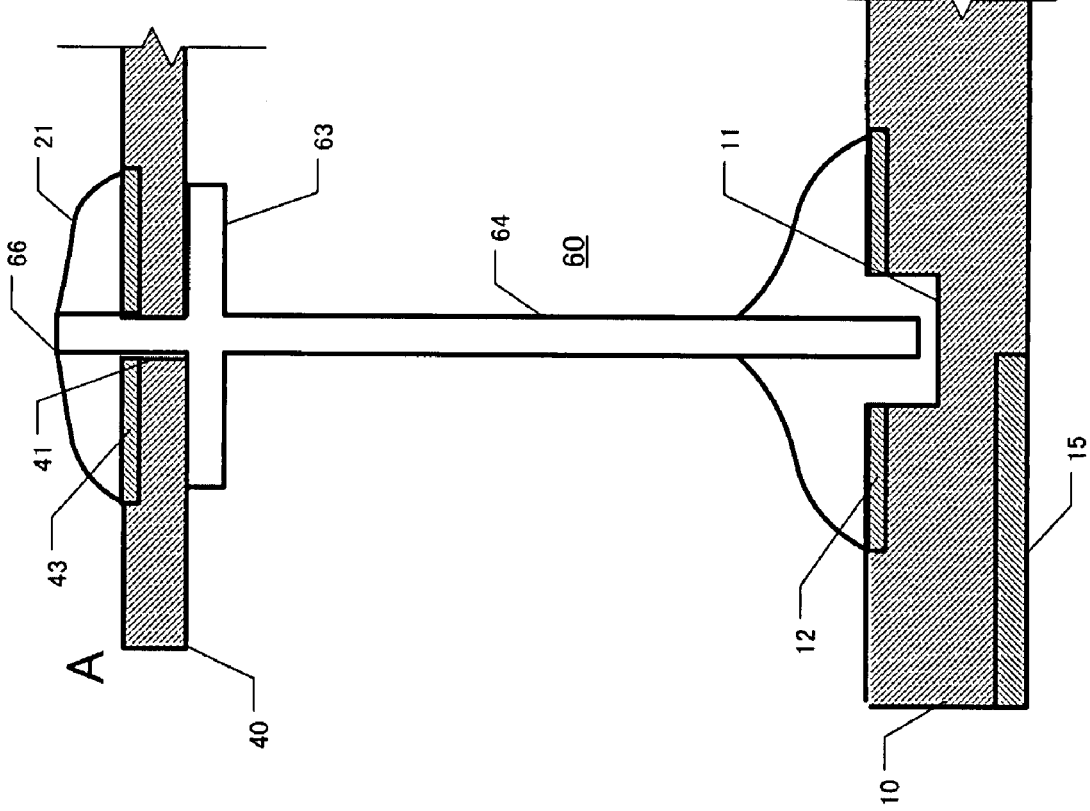
FIG. 3

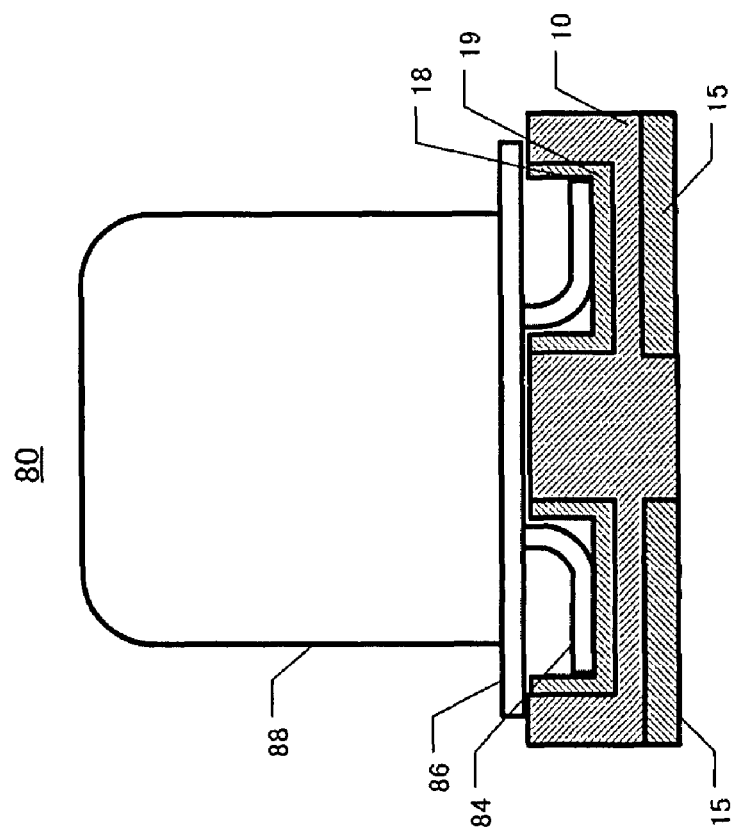
FIG. 5
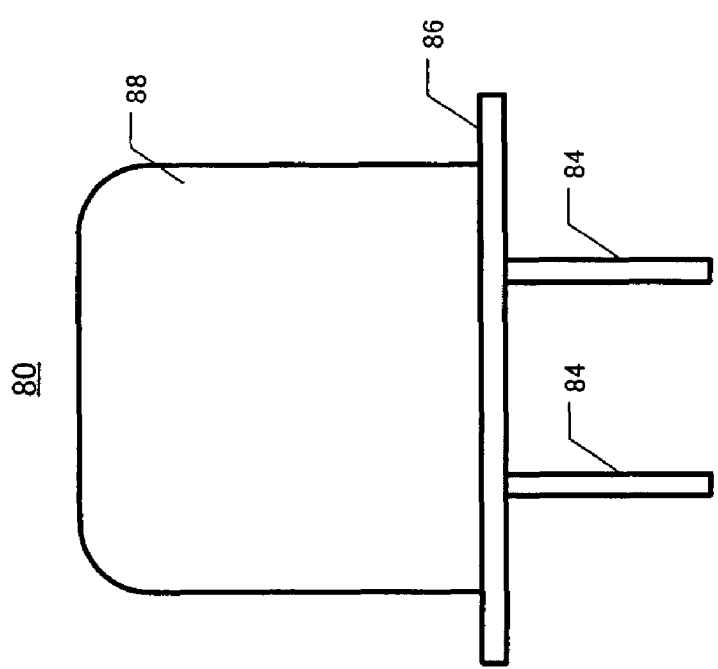

FIG. 6
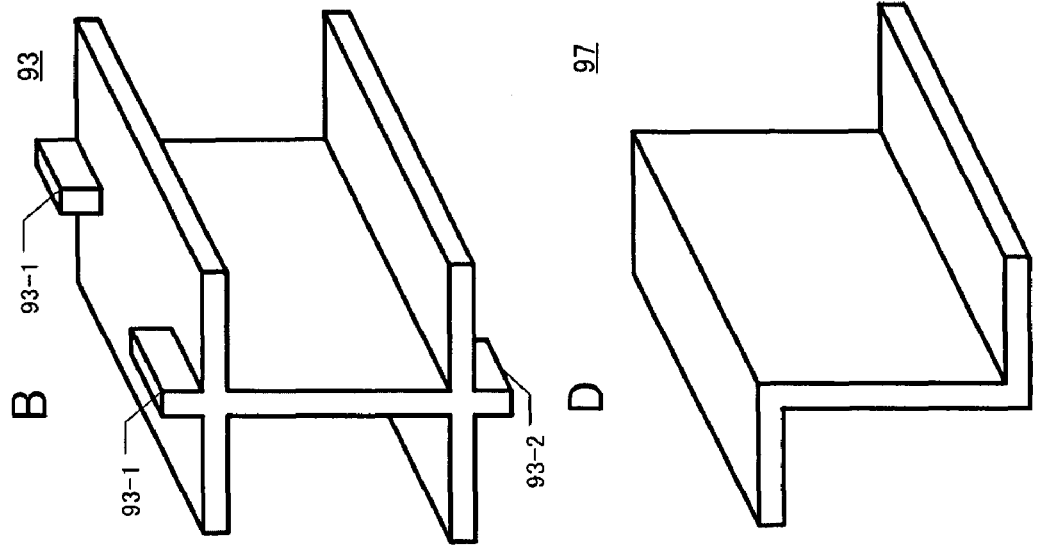
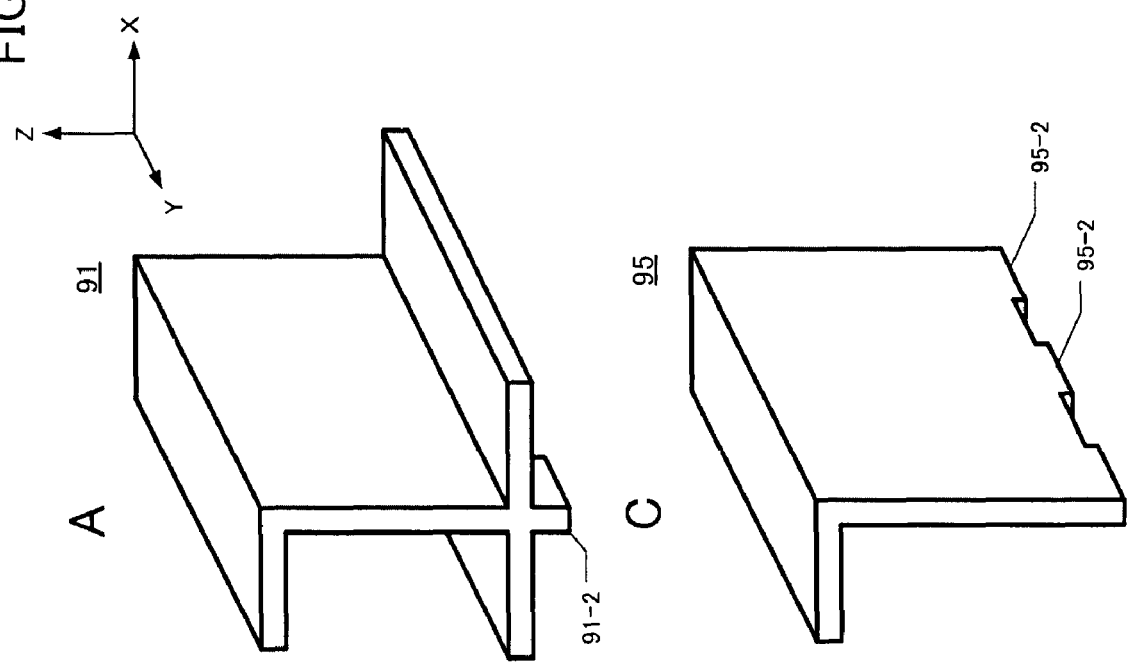

SURFACE MOUNTING PIEZOELECTRIC OSCILLATOR

CROSS-REFERENCE TO RELATED PATENT APPLICATION

This application claims the benefit of Japanese Patent Application No. 2006-264185 filed on Sep. 28, 2006 in the Japan Patent Office, the disclosure of which is incorporated herein in its entirety by reference.

BACKGROUND OF THE INVENTION

1. Field of the Invention

The present invention is related to a surface mounting piezoelectric oscillator consisting of especially base print board and sub print board containing crystal oscillator disposed on the base print board.

2. Description of the Related Art

Piezoelectric oscillator which provides stable frequency signal is widely used as a clock source for communication devices and electronic devices. Small-sized Surface Mount Device (SMD) types are being manufactured more because of miniaturization of those devices and for corresponding high frequency. Also, the change of surrounding temperature causes several ppm frequency changes of the piezoelectric oscillator so that a piezoelectric oscillator with improved electric characteristic can be used frequently.

In order to minimize mounting space in a high density circuit format, a surface mounting piezoelectric oscillator disclosed in Japanese Unexamined Patent Application Publication No. 2000-252748 adopted the structure of two layers of a base print board and a sub print board which has a crystal oscillator on its top. Also, in order to minimize an effect of ambient temperature and to enhance stability of the oscillatory frequency of the piezoelectric oscillator, some of the piezoelectric oscillators have two layers of the sub print board with the crystal oscillator to avoid direct effect of temperature changes outside of the oscillator.

The surface mounting piezoelectric oscillator consisting of the base print board and the sub print board conducts electrically from an external terminal to the sub print board. Also, the sub print board is needs to be supported on the base print board. Therefore, the surface mounting piezoelectric oscillator has a metal strut that conducts electrically to the sub print board and supports it at the same time.

The piezoelectric oscillator disclosed in Japanese Unexamined Patent Application Publication No. 2000-252748 has a soldered metal strut fixed to the base print board. In order to avoid the solder which fixes the metal strut touching the circuit board where the piezoelectric oscillator is attached to, a reentrant hole is created on the side of the circuit board as a through-hole. However, the solder may short out with the circuit board through the through-hole which is a part of reentrant hole because the solder may melt and leak out by the heat created when a piezoelectric oscillator is mounted to the circuit board.

This invention addresses the above-mentioned problems. An aspect of the present invention provides a highly reliable piezoelectric oscillator such that solder melted by heat does not leak from the oscillator and also the solder put on the mounted circuit board does not come into the piezoelectric oscillator.

SUMMARY OF THE INVENTION

The first aspect of the surface mounting piezoelectric oscillator comprises an external terminal formed on the first surface and a base print board with a concave portion formed on the second surface located on the other side of the first surface, a conductor strut fixed to the concave portion, a sub print board having piezoelectric vibrator and supported by the conductor strut, and a cover which is over the sub print board and the conductor strut.

According to the above-described features, the conductor strut is fixed to the concave portion of the base print board so that the conductor strut does not stick out from the base print board. Also, the through-hole is not formulated beneath the conductor strut; therefore, the solder in the piezoelectric oscillator or the solder of circuit board which is mounted to the piezoelectric oscillator does not get shorted out by touching the conductor strut. Thus, making a more reliable piezoelectric oscillator.

The second aspect of the surface mounting piezoelectric oscillator is comprises an external terminal formed on the first surface and a base print board with a concave portion formed on the second surface located on the other side of the first surface, a cap formed with a non-conductor with a concave portion fixed to the hole part the conductor strut fixed to the concave portion, a sub print board has piezoelectric vibrator and is supported by the conductor strut, and the sub print board and the conductor strut with a cover.

According to the above-described features, because the conductor strut is fixed to the concave portion of a non-conductive cap, the conductor strut does not stick out from the base print board; therefore, solder of the inside of piezoelectric oscillator or the solder of circuit board which is mounted to the piezoelectric oscillator does not touch the conductor strut, avoiding short outs.

The third aspect of the surface mounting piezoelectric oscillator is that, in the first or second aspect, the conductor strut has a first flange part, and the first flange part and the base print board are fixed.

According to the above-described features, because the first flange part which has a wide area is fixed to the base print board, it has durability to vibration on the piezoelectric oscillator. Therefore, a high integrity piezoelectric oscillator can be created.

The forth aspect of the surface mounting piezoelectric oscillator is that, in the third aspect, the conductor strut has the second flange part in different location from the first flange part, and the second flange part and the sub print board are fixed.

According to the above-described features, because the second flange part which has a wide area is fixed to the sub print board, it has durability to vibration on the piezoelectric oscillator. Therefore, a high integrity piezoelectric oscillator can be created.

The fifth aspect of the surface mounting piezoelectric oscillator is that, in the first or second aspect, the conductor strut has the first fold, and the first fold and the base print board are fixed.

According to the above-described features, because whole part of the folded first fold is fixed to the base print board, it has durability to vibration on the piezoelectric oscillator. Therefore, a high integrity piezoelectric oscillator can be created. Also, the conductor strut can be a one stick-shape or line-shape in order to reduce the costs.

The sixth aspect of the surface mounting piezoelectric oscillator is that, in the fifth aspect, the conductor strut has the second fold in different location from the first fold, and the second fold and the sub print board are fixed.

According to the above-described features, because whole folded part of the second fold is fixed to the sub print board, it has durability to vibration on the piezoelectric oscillator. Therefore, high integrity piezoelectric oscillator can be created.

The seventh aspect of the surface mounting piezoelectric oscillator is that a first conductor membrane is formed around an area of the base print board where the first flange part is fixed, and the conductor strut and the first conductor membrane are fixed by conductive property part.

According to the above-mentioned features, conduction is secured from the base print board through the conductor strut to the sub print board. From this reason, exchanging of signal between the base print and the sub print board, and electric power distribution can be done properly. Note that conductive member is a material containing solder or electrically conductive adhesive. The conductor membrane contains a copper plating or lead wire.

The eighth aspect of the surface mounting piezoelectric oscillator is that a first conductor membrane is formed around an area of the base print board where the first fold is fixed, and the conductor strut and the first conductor membrane are fixed by conductive property part.

According to the above-mentioned features, conduction is secured from the base print board through the conductor strut to the sub print board. From this reason, exchanging of signal between the base print board and the sub print board, and electric power distribution can be done properly.

The ninth aspect of the surface mounting piezoelectric oscillator is that the surface mounting piezoelectric oscillator comprises a terminal at the first surface, a base print board has a concave portion at a second surface which is on an opposite side from the first surface, a lead oscillator with folded lead terminal, and fixes a folded lead terminal at the concave portion.

According to the above-mentioned features, the piezoelectric oscillator having the lead terminal can be changed to the surface mount piezoelectric oscillator. The folded lead terminal is fixed to the concave portion of the base print board so that the lead terminal does not stick out from the base print board. Also, the solder of circuit board which is mounted to the piezoelectric oscillator does not get short out by touching the lead terminal. Thus, even when the circuit board is transported up side down in a reflow furnace, the solder of the circuit board does not get into the piezoelectric oscillator.

The tenth aspect of the surface mounting piezoelectric oscillator is, from the ninth aspect, the terminal and concave part are electrically attached to the first surface. Thus, the electrical conduction between the circuit board, which is a surface mounted piezoelectric oscillator, and the piezoelectric oscillator is secured.

This invention shows that the solder does not enter the terminal of the surface mounting piezoelectric oscillator from the opposite side. Embodiments of this invention are illustrated as follows and also with reference to the figures.

BRIEF DESCRIPTION OF THE DRAWINGS

FIG. 2 is illustrative of a fixation of the base print board 10 and sub print board 40 by the first metal strut 50.

FIG. 3 is illustrative of a fixation of the base print board 10 and sub print board 40 by the second metal strut 60.

FIG. 5 is illustrative of to change piezoelectric oscillator 80 with two or four lead terminals into surface mounting piezoelectric oscillator 80.

FIG. 6 is illustrative of transformation samples of a plate-shape metal strut that is mentioned above.

DETAILED DESCRIPTION OF ILLUSTRATIVE EMBODIMENTS

Embodying Example

Figure 1:
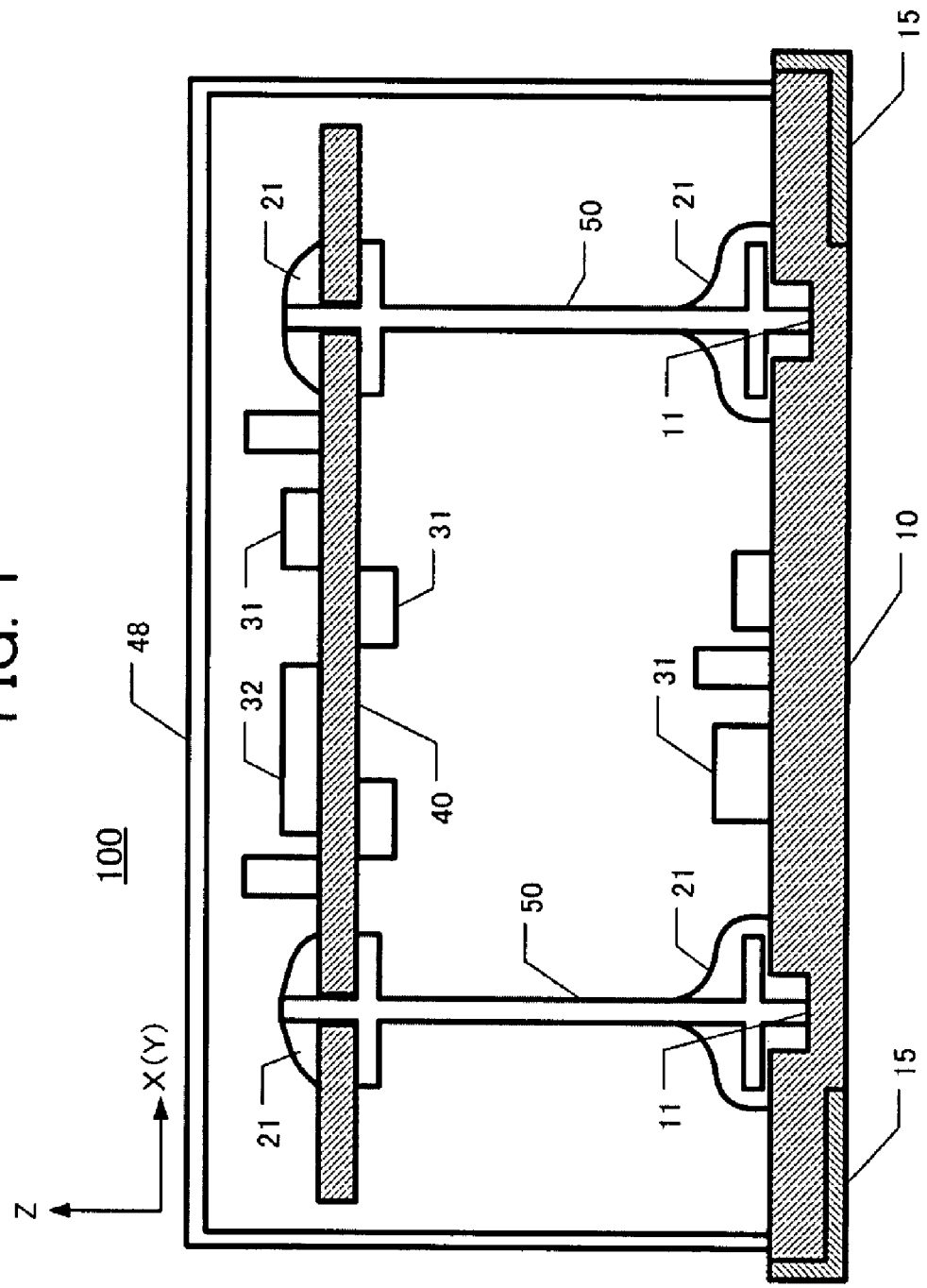
FIG. 1 is illustrative of a cross-sectional view of embodiment of surface mounting piezoelectric oscillator related to this invention.

FIG. 1 is a cross-section view showing an embodying example of the surface mounting piezoelectric oscillator. A piezoelectric oscillator 100 consists of a base print board 10 and a sub print board 40. Some of electric parts 31 for an oscillating circuit are fixed to the base print board 10 by solder. Some of the electric parts 31 for the oscillating circuit and a crystal oscillator 32 are fixed to the sub print board 40 by solder. In order for the piezoelectric oscillator to be mounted on the surface at the circuit oscillator, an external terminal 15 which are set 4 or 6 areas are set on the bottom or side of base print board 10.

Also, an edge of a first metal strut 50 which is formed by brass and others is inserted to a concave portion 11 and fixed by solder 21 at the base print board 10. The other edge of the first metal strut 50 is fixed to the sub print board 40 by solder 21. A metal case 48 covers all as it seals the two-tiered base print board 10 and the sub print board 40. The size of piezoelectric oscillator 100 of such features is 3 mm corner to 50 mm corner.

FIG. 2 shows fixation of the base print board 10 and the sub print board 40 by the first metal strut 50. FIG. 2A is a perspective-view of the first metal strut 50. FIG. 2B shows fixation of the base print board 10 and the first metal strut 50, and the sub print board 40 and the first metal strut 50.

As FIG. 2 shows that the first metal strut 50 has a first flange 51 and a second flange 53 at both ends of brass shaft 54. The brass shaft 54 has a first shaft 52 and a second shaft 56 which penetrated both the first flange 51 and the second flange 53. The diameter of the brass shaft is from about 0.03 mm to 1 mm, and the diameter of first flange 51 and second flange 53 is 0.04 mm to 3 mm which should be twice as much as the diameter of the brass shaft 54.

As FIG. 2 shows, there is the concave portion 11 at the base print board 10 into which the first shaft 52 can be inserted. The base print board 10 is composed of a grass epoxy material. The thickness of base print board 10 is about 0.6 mm to 3 mm, and the depth of concave portion 11 is 30 to 90% of thickness of the base print board 10. The diameter of concave portion 11 is smaller than of the first flange 51 and same as or bigger than shaft 52. A flat mill is used for making the concave portion 11 at the base print board 10. The concave portion 11 is coated with copper coat 12. An external terminal 15 and the copper coat 12 are electrically connected. First flange 51 of the metal strut 50 is fixed to the copper coat 12 by solder. Instead of using solder 21, electrically conductive adhesive can be used to fix them. Since concave portion 11 is not penetrated to the external terminal 15 end, solder 21 does not melt and leak by heat. When first flange 51 and the copper coat 12 are attached tenaciously, they can be fixed by nonconductive adhesive instead of by solder 21.

The sub print board 40 has a hole 41 which is completely penetrated through to the other side of the board for inserting a second shaft 56. The hole can be a concave portion instead of penetrated hole. The diameter of the hole 41 is smaller than the diameter of the second flange 53 and the same or bigger diameter than the second shaft 56. The sub print board 40 is a glass epoxy material and a thickness of the sub print board 40 is about 0.6 mm to 3 mm. The hole 41 is coated with copper coat 43. The second shaft 56 of the first metal strut 50 is fixed to the copper coat 43 at the surface of the sub print board 40 by solder and connected electrically. Thus, the electric power of the external terminal 15 reaches the sub print board 40.

FIG. 3 shows a fixation of the base print board 10 and the sub print board 40 by a second metal strut 60. FIG. 3A shows a fixation of the base print board 10 and the sub print board 40 by the second metal strut 60. FIG. 3B shows a fixation of the base print board 10 and the sub print board 40 by using the metal strut 60 in another process.

A difference between the second metal strut 60 drawn in FIG. 3A and the first metal strut 50 drawn in FIG. 2B is the presence of the first flange 51. Other components are substantially the same. That is, the second metal strut 60 has a second flange 63 at one end of brass shift 64. The concave portion 11 is formed on the base print board 10 for inserting brass shaft 64. The thickness of the base print board 10 is about from 0.6 mm to 3 mm, and the depth of the concave portion 11 is 30 to 90% of the thickness of the base print board 10. The diameter of the concave portion 11 is the same diameter of the brass shaft 64 or bigger than that. The concave portion 11 is coated with the copper coat 12. The external terminal 15 and the copper coat 12 is electrically connected. The brass shaft 64 of the metal strut 60 is fixed to the copper coat 12 by solder. Since the concave portion 11 is not penetrated to the external terminal 15 end, solder 21 does not melt and leak by heat. Note that compared to FIG. 2B, because there is no first flange 51 at the second metal strut 60, it is weak against vibration but it is low cost to manufacture. The configuration of the second shaft 66 of the metal strut 60 inserted to the hole 41 of the sub print board 40 and fixed by the solder 21 is the same configuration as FIG. 2B.

In FIG. 3B, structure of the base print board 10 is different from FIG. 3A. A penetrated hole 19 is formed instead of the concave portion 11 on the base print board 10. A cap 68 with flange is inserted into the penetrated hole 19. The cap 68 with flange is composed of a heat resistance non-conductor such as a thermosetting plastic. A diameter of the flange is smaller than an area where the copper coat 12 is formed. Also, an insert hole (concave) 69, where a brass shaft 64 of the second metal strut 60 is inserted, is formed on a cap 68 with flange. The insert hole 69 does not penetrate a cap 68 with flange completely. The copper coat 12 is finished around the penetrated hole 69. The external terminal 15 and copper coat 12 are electrically connected. The brass shaft 64 of the second metal strut 60 and the copper coat 12 is fixed by the solder 21. The penetrated hole 19 is sealed with the cap 68, and also the insert hole 69 formed on the cap 68 is not fully penetrated, therefore, the solder 21 does not melt and leak out. The external terminal 15 of FIG. 3B, which has the penetrated hole 19, is shorter than the one of FIG. 3A. Because it avoids contact failure, the bigger external terminal is recommended when it is mounted to the circuit board. Note that the configuration of the second shaft 66 of the metal strut 60 inserted to a hole 41 of the sub print board 40 and fixed by the solder 21 is the same configuration as FIG. 2B.

Figure 4:
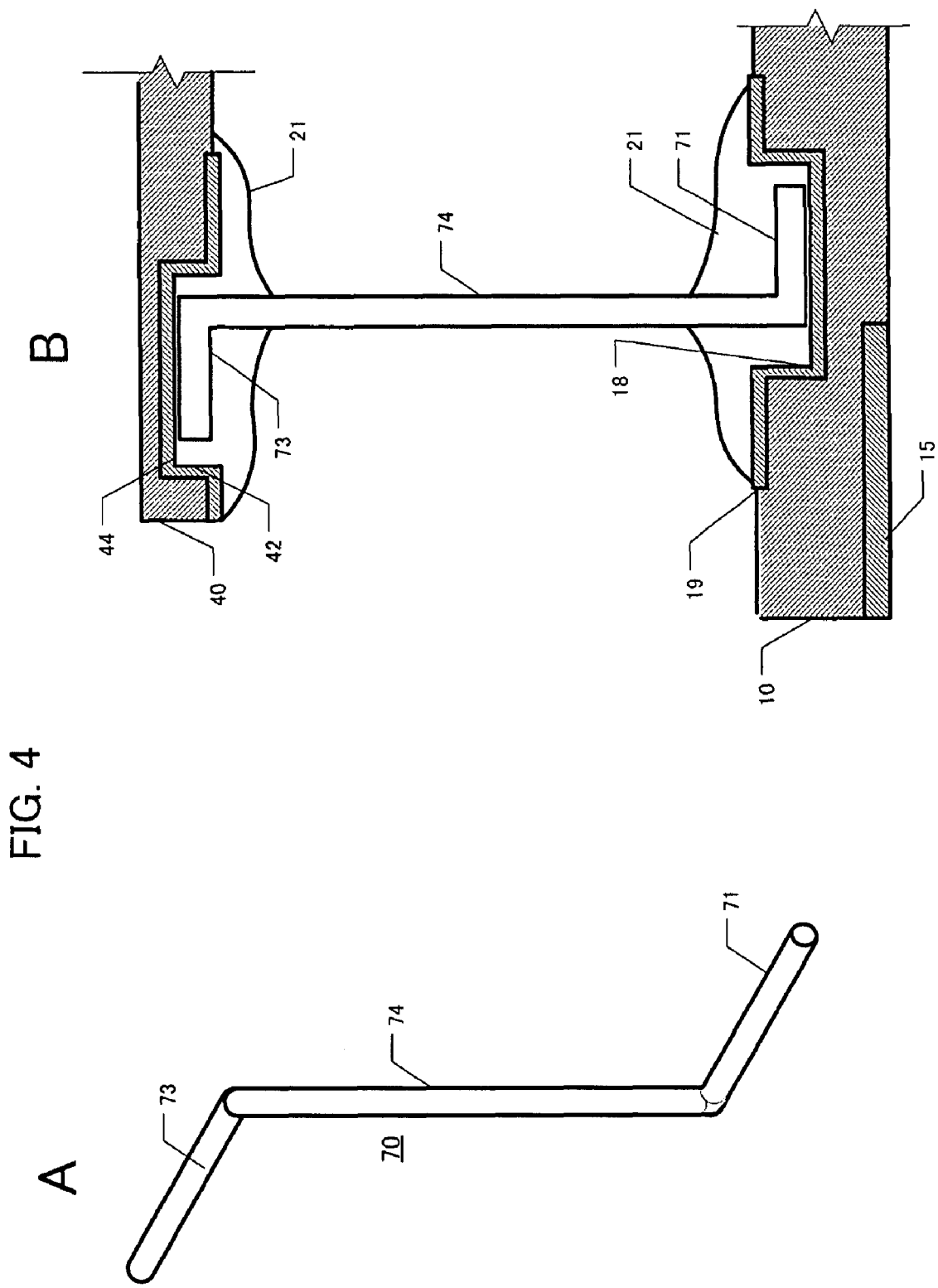
FIG. 4 is illustrative of a fixation of the base print board 10 and sub print board 40 by the third metal strut 70.

FIG. 4 shows fixation of the base print board 10 and the sub print board 40 by a third metal strut 70. FIG. 4A is a perspective view of the third metal strut 70 and FIG. 4B shows fixation of the base print board 10 and the third metal strut 70, and the sub print board 40 and the third metal strut 70.

As show in FIG. 4A, the third metal strut 70 is bent 90 degrees in the middle of the brass shaft 74 and has a first fold 71 and a second fold 73. The diameter of the brass shaft 74 is 0.03 mm to 1 mm. The length between the first fold 71 and second fold 73 is 1 mm to 3 mm.

As shown in FIG. 4B, a concave portion 18 is formed on the base print board 10 to insert into the first fold 71. The thickness of the base print board 10 is 0.6 mm to 3 mm, and the depth of the concave portion 18 is formed 30 to 90% of the thickness of the base print board 10. The width of the concave portion 18 is bigger than or the same size as the diameter of the first fold 71. The concave portion 18 is thinner than the concave portion 11 drawn in FIG. 2. Therefore, the copper coat 19 is finished not only around the concave 18 but also the concave portion 18 itself. The external terminal 15 and the copper coat 19 are electrically connected. The first fold 17 of the third metal strut 70 and the copper coat 19 are fixed by the solder 21. Because the concave portion 18 is not fully penetrated to the external terminal 15 end of the base print board 10, the solder 21 does not melt and leak out.

A concave 42 is formed on the sub print board 40 for inserting the second fold 73. The width of concave 42 is bigger than or the same size as the width of second fold 73. The sub print board 40 is comprised of a glass epoxy material and a thickness of the sub print board 40 is 0.6 mm to 3 mm. The depth of the concave 42 is formed 30 to 90% of the thickness of the sub print board 40. The copper coat 44 is finished both concave 42 itself and around the concave. The second fold 73 and copper coat 44 is electrically connected. Thus electricity of the external terminal 16 reaches the sub print board 40. As this configuration, the sub print board 40 is supported by the base print board 10 as two-tiered. The first fold 71 or the second fold 73 become stronger against vibration by bending because the wide area of metal strut attaches to the concave portion 18 and 42. Also, it is cost less because it is just to fold the metal.

FIG. 5 shows changing the piezoelectric oscillator with lead terminal 80 which has two or four lead terminals into the surface mounting piezoelectric oscillator 80. FIG. 3A shows the piezoelectric oscillator with lead terminal 80. FIG. 3B is a cross-sectional view of the surface mounting piezoelectric oscillator 80. In the past, the piezoelectric oscillator with lead terminal 80 is used as a surface mounting piezoelectric oscillator by making holes to a base print board and penetrating shortened lead terminal to the hole. However, on this features, there is a possibility that lead terminals stick out and be exposed from the base print board or may cause a short out on the surface mounted circuit board.

The piezoelectric oscillator with lead terminal 80 illustrated in FIG. 5A is equipped with a chassis 88 with crystal oscillator, a seal board 86 to seal the chassis, and four lead terminals 84 sticking out from the seal board 86. The four lead terminals 84 are the same as the brass shaft 74 showed in FIG. 4. The base print board 10 drawn in FIG. 5B is the same as the base print board 10 drawn in FIG. 4. In FIG. 5B, the four lead terminals 84 of the piezoelectric oscillator with lead terminal 80 are bended to 90 degrees in the middle.

A concave portion 18 is formed on the base print board 10 for inserting bended lead terminal 84. The thickness of the base print board 10 is 0.6 mm to 3 mm, and the depth of the concave portion 18 is 30 to 90% of the base-print 10. The width of the concave portion 18 is the same diameter or bigger than the lead terminal 84. The copper coat 19 is finished not only around the concave portion 18 but also the concave portion 18 itself. The external terminal 15 and the copper coat 19 are electrically connected. The lead terminal 84 and the copper coat 19 are fixed by a shortened solder 21. Because the concave portion 18 is not fully penetrated to the external terminal 15 end of the base print board 10, the solder 21 does not melt and leak out. Also, the lead terminal 84 does not stick out at the side of the external terminal 15 on the base print board 10.

FIG. 6 shows transformation samples of a metal strut. The metal strut as explained above is cylinder or wire shape, but it can be a plate shape as well. The piezoelectric oscillator often requires high reliability and a long term performance guarantee. Especially the support stiffness toward a lateral direction of the metal strut is low and when the piezoelectric oscillator receives an unexpected high impact, the metal strut may get transformed, and it enormously affects reliability and electrical performance.

If the metal strut touches a case because of the elasticity of the metal strut or transformation caused by high impact, an electrical short or diffusion of heat to the case may occur and can cause change of capability or destroy circuit parts. In preparation for such a case, a metal strut with plates shape may be prepared.

FIG. 6 is the metal strut 91 which has a flange on the side of the base print board 10 and a folded board part on the side of the sub print board 40. Note that a board protruding portion 91-2 has some short width protruding. FIG. 6B shows the metal strut 91 has a flange on the base print board 10 side and the sub print board 40 side. FIG. 6B is the metal strut 93 and as shown in FIG. 6B, short width protruding portion are formed on the board because if the protruding portion of the board are formed same width of the board, they might be broken and cut by the concave portion of the sub print board 40. The protruding portion 93-1 of the base print board 10 is the same spec as previous protruding portion. The protruding portion 93-2 of the base print board 10 has the same configuration.

FIG. 6C is a metal strut 95 having a bend in its board of sub print board 40 side. Note that some short width protruding portion 95-2 are formed on the side of the base print board 10 side. This is because if the protruding portion 95-2 is formed full width of the board, they might be broken and cut by the concave of the base print board 10. FIG. 6D shows the metal strut 97 having bended both sides of base print board 10 side and sub print board 40 side.

For each metal strut shown in FIG. 6, a concave portion is formed on the base print board 10. Also, the concave itself and around the concave are finished with the copper coat. The concave part is not fully penetrated to the external terminal 15 side of the base print board 10 so that the solder 21 does not melt and leak out by heat from it. Because of this, high reliable piezoelectric oscillator with improved impact resistance can be made.

The piezoelectric oscillators of this embodiment may be Temperature Compensated Crystal Oscillators (TCXO), Voltage Controlled Crystal Oscillator (VCXO), Oven-Controlled Crystal Oscillator (OCXO), or Oscillator with lead terminal, but can also be of a surface mounting terminal configuration of not only an oscillator but also an LC oscillator, SAW oscillator, or other electric parts. As piezoelectric material, crystal oscillators or ceramics can be used. Also, as explained with respect to the metal strut part, it can be any material if it is conductive material, for example, conductive plastic can be used.

What is claimed:

1. A surface mounting piezoelectric oscillator comprising:
    an external terminal formed on a first surface of a base print board,
    a cap composed of a non-conductor, which is inserted into a hole portion which penetrates said base print board from the first surface to a second surface in order to seal the hole, wherein the cap has a concave portion,
    a conductor strut fixed to the concave portion,
    a sub print board having a piezoelectric vibrator coupled thereon, said sub print board being supported by the conductor strut, and
    a cover over the sub print board and the conductor strut.

2. The surface mounting piezoelectric oscillator of claim 1, wherein the conductor strut has a first flange part fixed to the base print board.

3. The surface mounting piezoelectric oscillator of claim 2, wherein the conductor strut has a second flange part fixed to the sub print board located in a different location from the first flange part.

4. The surface mounting piezoelectric oscillator of claim 1, wherein the conductor strut has a first fold fixed to the base print board.

5. The surface mounting piezoelectric oscillator of claim 4, wherein the conductor strut has a second fold fixed to the sub print board located in a different location from the first fold.

6. The surface mounting piezoelectric oscillator of claim 2, wherein a first conductor membrane is formed in an area proximate the base print board to which the first flange part is fixed, the first conductor membrane is electrically connected to the external terminal, and the conductor strut and the first conductor membrane are fixed by a conductive property member.

7. The surface mounting piezoelectric oscillator of claim 4, wherein a first conductor membrane is formed in an area proximate the base print board to which the first fold is fixed, the first conductor membrane is electrically connected to the external terminal, and the conductor strut and the first conductor membrane are fixed by a conductive property member.

* * * * *